United States Patent [19]
Voisine et al.

[11] Patent Number: 5,231,347
[45] Date of Patent: Jul. 27, 1993

[54] POWER FACTOR MATCHING IN AN AC POWER METER

[75] Inventors: John T. Voisine; Christopher L. Anderson; Gregory L. Dykstal, all of Lafayette, Ind.

[73] Assignee: Landis & Gyr Metering, Inc., Lafayette, Ind.

[21] Appl. No.: 843,318

[22] Filed: Feb. 28, 1992

[51] Int. Cl.$^5$ .................... G01R 21/00; G01R 35/04
[52] U.S. Cl. ...................... 324/142; 324/74; 324/107
[58] Field of Search ............... 324/74, 138, 141, 142, 324/130, 107; 323/208, 218; 364/483, 492, 571.01, 551.01

[56] References Cited

U.S. PATENT DOCUMENTS

| | | | |
|---|---|---|---|
| 2,189,660 | 2/1940 | Boudreau | 175/183 |
| 2,749,502 | 6/1956 | Ragazzini et al. | 323/218 |
| 2,778,988 | 1/1957 | Pihl | 323/218 |
| 2,794,948 | 6/1957 | Thompson et al. | 323/218 |
| 3,210,649 | 10/1965 | Seay | 323/218 |
| 3,250,984 | 5/1966 | Gabriels et al. | 323/208 |
| 3,684,948 | 8/1972 | Eissmann | 323/43.5 R |
| 3,688,183 | 8/1972 | Schmitt | 323/218 |
| 3,806,794 | 4/1974 | Vidovic | 323/218 |
| 3,959,724 | 5/1976 | Chana et al. | 324/142 |
| 4,054,829 | 10/1977 | Searle | 323/6 |
| 4,158,808 | 6/1979 | Massa et al. | 324/74 |
| 4,200,933 | 4/1980 | Nickel | 324/74 |
| 4,356,446 | 10/1982 | Battocletti | 324/142 |
| 4,485,343 | 11/1984 | Milkovic | 324/142 |
| 4,843,306 | 6/1989 | Meuller | 324/74 |
| 4,949,029 | 8/1990 | Cooper et al. | 324/74 |
| 5,017,860 | 5/1991 | Germer et al. | 324/74 |

Primary Examiner—Vinh Nguyen
Attorney, Agent, or Firm—Woodard, Emhardt, Naughton, Moriarty & McNett

[57] ABSTRACT

A solid-state AC energy consumption meter includes an array of AC signal transducers which provide voltage and current signals to a watt transducer chip. The watt transducer chip operates on the multi-phase voltage and current signals to produce AC energy consumption data which is fed to a register for visual display. In one aspect of the invention, a calibrating resistive component is placed in series with the input to the primary coil of the potential transformer for each phase. The value of the resistive component is calibrated to produce an appropriate change in the phase angle difference between the potential transformer secondary voltage and current transformer secondary current. More particularly, the addition of the resistance of the primary of the potential transformer provides the necessary amount of phase lead to the potential transformer to account for this phase error difference.

19 Claims, 2 Drawing Sheets

POWER FACTOR MATCHING IN AN AC POWER METER

BACKGROUND OF THE INVENTION

The present invention concerns solid-state meters for measuring AC electrical energy, or power, consumed by a load. In particular, the invention concerns watthour and varhour meters, or the like, utilizing potential and current transformers. More specifically, the invention concerns an improvement in power factor matching of the potential transformer to the current transformer.

Electronic or solid-state watthour (or varhour) meters have been known since the early 1970's. In meters of this type, the load current and line voltage are sensed and corresponding current and voltage signals are input into a measurement circuit. These current and voltage signals are processed by the measurement circuit to produce an output signal indicative of the AC electrical energy consumption by the load, which signal is then supplied to a register for further processing and display.

An example of one type of solid-state watthour meter is shown in FIG. 1. More particularly, the meter 10 includes an array of AC quantity transducers 12 which produce voltage and current signals for each phase of a polyphase system. These voltage and current signals are fed to measurement circuit means 14, which in the illustrated embodiment is a watt transducer chip. In one specific embodiment, the measurement circuit 14 comprises a custom integrated circuit which performs Time Division Multiplication of the voltage and current signals by way of a mark space oscillator and an amplitude modulator applied to the respective voltage and current signals. An appropriate measurement circuit means or watt transducer chip can be found in the Landis & Gyr SSM20 meter. Some details of this chip can be found in U.S. Pat. No. 4,896,106, at columns 3–5, which description is incorporated herein by reference.

The measurement circuit means 14 generates AC energy consumption data 16 which is fed to a register 18. The register can include a microprocessor which manipulates the energy or power consumption data to produce, for example, time of use information. The register 18 includes a display, a memory, and an option board in one specific embodiment. A power supply transformer 20 provides DC power to both the measurement circuit means 14 and the register 18.

In the illustrated solid-state watthour meter, the array of AC quantity transducers 12 include a number of potential transformers $22_{1-3}$ and a number of current transformers $23_{1-3}$. One each of the potential and current transformers is provided for each phase of a three phase AC power supply system in the illustrated embodiment. The solid state watthour meter 10 shown in FIG. 1 as thus far described is of a known construction.

In any AC energy consumption or power metering, it is essential to have a correct registration between the voltage and current signals provided to the measurement circuit. When the registration between these voltage and current signals deviates from an expected value, the calculations of the AC energy usage, whether it be watthours or varhours, is compromised. In any AC metering arrangement, the AC power drawn by the load can vary at different load power factors. This variation in the load power factor can cause a deviation between the measured and displayed energy consumption value and the actual AC energy consumption by the load. It is known that the power factor is the ratio of the active power to the apparent power (which is the square root sum of the squares of the active and reactive power). Consequently, the power factor is a function of the phase angle difference between the AC current and voltage provided by the AC source.

In the late 1800's, it was determined that in order for a meter to have a correct registration with varying load power factor, the potential transformer flux must lag the current transformer flux by exactly 90° when the load on the meter is at the unity power factor. This 90° relationship at unity power factor was determined to be necessary to maintain a driving force on the meter disc proportional to the power at any load power factor value. In inductive meters of the prior art, a phasing band or coil was provided around the core of the center leg of the potential coil to cause the potential transformer flux to lag the current transformer flux by 90°. Shifting the current transformer flux towards the potential transformer flux until the power factor angle was exactly 90° has been accomplished by inserting a closed "figure 8" circuit loop on the current magnets to produce a voltage in that loop, which causes current to flow in the loop thereby creating a counter-acting flux field.

Alternatively, a lag plate has been moveably positioned on the pole piece of the potential transformer to provide adjustable phase compensation of the voltage signal wit respect to the current signal. Many modern meters use a fixed lag plate operating on the potential flux with the phase compensation being permanently made by the manufacturer at the factory.

As solid-state meters replace the standard inductive meter, the concern over maintaining a proper meter disc driving force diminishes. However, the importance of power factor matching to meter registration has not diminished. The meter power factor defines the relationship between energy usage measurement values such as watts, vars and volt-amperes. It is therefore necessary to control and match the meter power factor to minimize any error in the metered AC energy consumption versus the true energy consumed by the load.

SUMMARY OF THE INVENTION

The present invention contemplates a solid-state meter connected to a source of AC line current and load voltage for measuring AC electrical energy consumption by a load. The meter includes a current transformer and a potential transformer for sensing the respective AC quantities for each phase. The transformers produce voltage and current signals which are provided to measurement circuit means which operates on the signals to produce data indicative of the AC electrical energy usage by the load. A register provides means for displaying the usage data.

The potential transformer has a primary coil connected across the AC source and a secondary coil for producing a voltage signal proportional of the AC load voltage, wherein the voltage signal lags the current signal by a phase angle corresponding to the power factor of the meter. The invention contemplates power factor adjustment means for adjusting the phase angle between the voltage signal and the current signal by adding a phase lead to the primary coil of the potential transformer. This power factor adjustment means comprises a resistive component connected in series with the input to the primary coil of the potential transformer. This resistive component can be a variable resistor, a fixed value replaceable resistor, or a resistor network adjustable by shorting around fixed resistors.

The resistive component can be adjusted or varied to introduce an appropriate amount of phase lead, thereby tuning or matching the power factor angle between the current and voltage signals. The resistance value $R_{cal}$ for the resistive component can be selected according to the following equation:

$$R_{cal} = 2*\pi*f*L*\Delta \text{ TAN }(\theta),$$

where $R_{cal}$ is the resistance value in ohms, f is the frequency of the AC signal, L is the inductance in henrys of the potential transformer, and $\Delta \text{ TAN}(\theta)$ is the difference in the tangent of the phase angle between the voltage and current signals. It has been found that the series resistance produces a deviation in output voltage from the secondary. In order to minimize this voltage deviation, the resistance value $R_{cal}$ preferably has a value that is less than or equal to the total primary winding resistance of the potential transformer.

It is one object of the invention to provide a means for power factor matching of a potential transformer to a current transformer in a solid-state meter monitoring AC electrical energy consumption by a load. A further object is to provide such a means which can be readily and easily calibrated, such as by the variation of a resistance value.

Another object is achieved by the elimination of complex mechanical or electrical components to accomplish the power factor matching feature of the invention. Further objects and certain benefits of the invention will become apparent from the following written description in conjunction with the accompanying figures.

DESCRIPTION OF THE PREFERRED EMBODIMENTS

Figure 1:
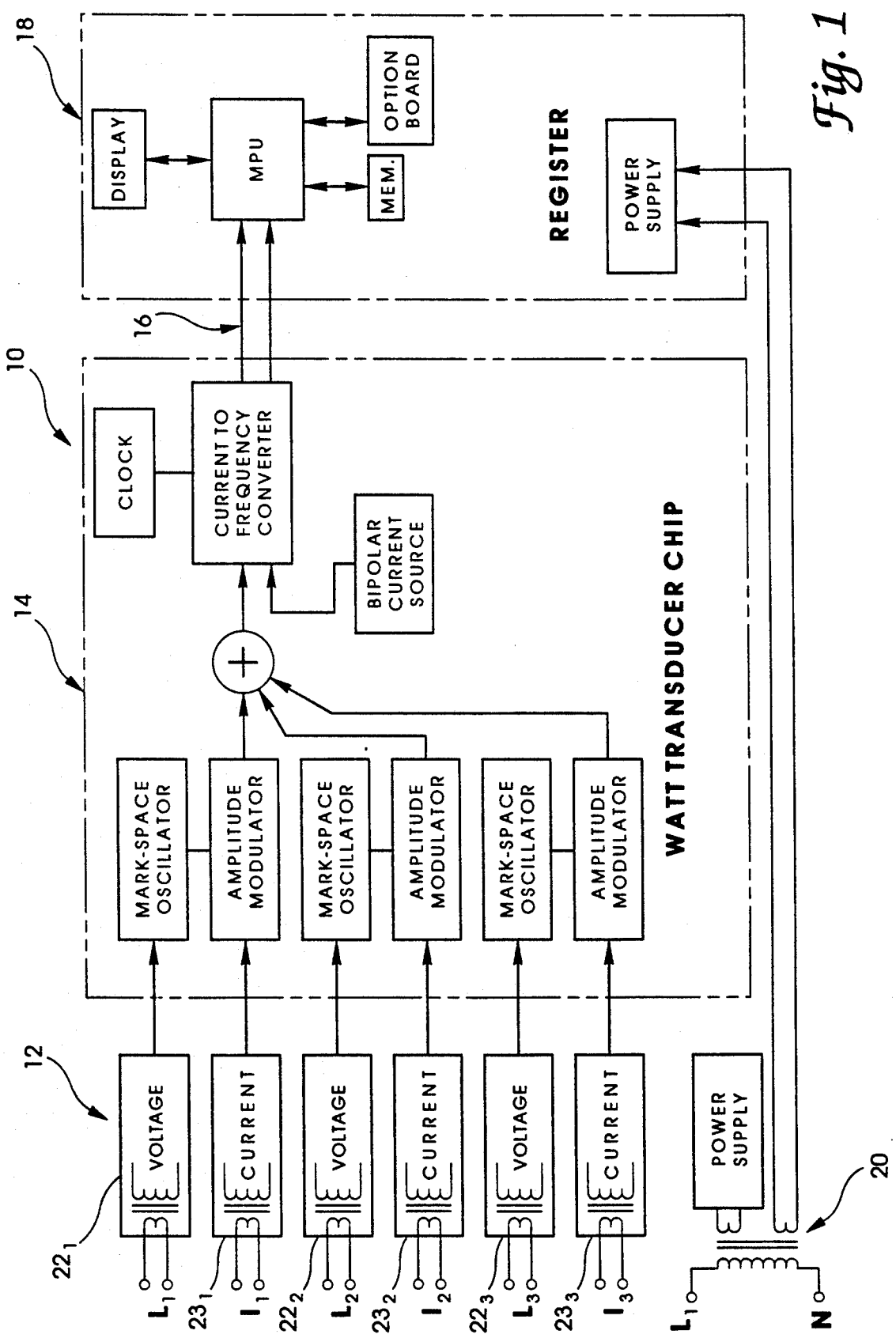
FIG. 1 is a schematic circuit diagram of the principal components of a solid-state watthour meter or of a known solid-state watthour meter.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 2:
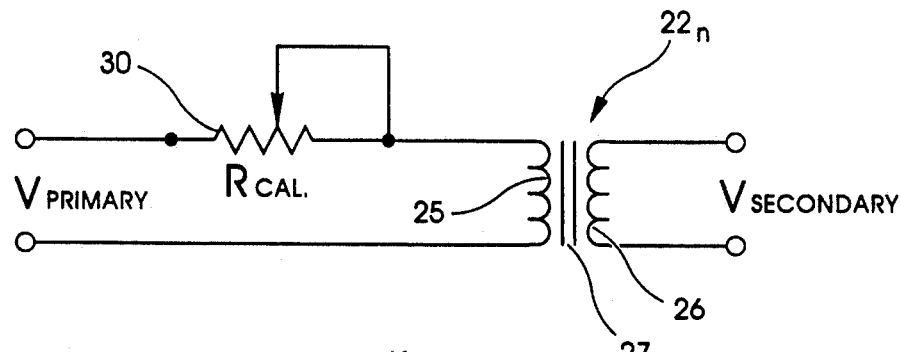
FIG. 2 is a circuit diagram of a potential transformer with the power factor matching feature of the present invention.

The present invention contemplates a modification to the potential transformers used with the known solid-state meter depicted in FIG. 1. Referring more particularly to FIG. 2, a potential transformer $22_n$ is shown, which can be substituted for one of the transformers $22_1$-$22_3$ for the solid-state watthour meter 10 shown in FIG. 1. The potential transformer $22_n$ includes a primary coil 25 which is connected across the load, a secondary coil 26 which produces a voltage that is provided to a mark space oscillator in the measurement circuit means 14, and an iron core 27, about which the respective primary and secondary coils are wound. In one typical installation, the primary voltage, that is the load voltage, is 220 volts. This value can be stepped down by an appropriate turns ratio between the primary and secondary coils so that the output voltage across the secondary coil 26 is reduced to a level that can be readily provided to the measurement circuit means 14.

It has been found that in a typical metering set-up, the potential transformer secondary signal lags the secondary signal from the current transformer. Thus, the phase angle, or phase difference, between the voltage and current signals must be matched or accommodated by an appropriate phase lead added to the potential transformer primary coil. It has been found as part of the invention that an appropriate calibratable amount of phase lead can be added by introducing a resistive component 30 in series with and at the input to the primary coil 25. The calibrating resistive component 30 can have a value $R_{cal}$ which can be adjusted to produce the appropriate phase lead to account for the phase error, or phase lag, between the potential transformer secondary and the current transformer secondary.

According to circuit theory, the added phase lead accomplished by a particular value for $R_{cal}(\Omega)$, or more particularly the difference in the tangents of the power factor angles between the current circuit power factor and the voltage circuit power factor, can be derived from the following equation:

$$\Delta \text{ TAN }(\theta) = R_{cal} / (2\pi f L),$$

where f is the frequency (in Hz) of the applied AC signal and L is the inductance (in Henrys) of the potential transformer.

Conversely, where a specific phase angle calibration or correction is desired, the above value of the resistive component $R_{cal}$ can be obtained by multiplying $\Delta$ TAN ($\theta$) by ($2\pi f L$). The effect on the meter registration of the difference in the tangent of the phase angles ($\Delta$ TAN ($\theta$)) is a function of the power factor, or the expected phase angle between voltage and current of the customer's load. Thus, the same value resistive component will have a different calibration effect on a meter at a load power factor of 1.0 versus a load power factor of 0.5.

Figure 3:
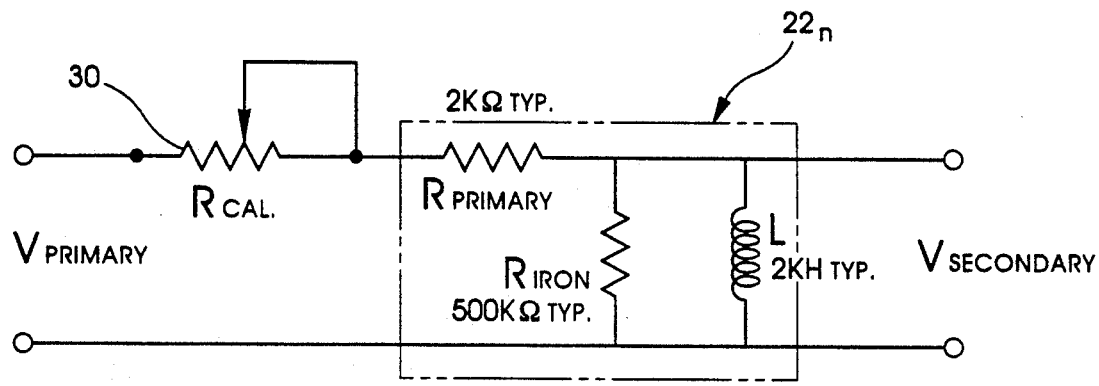
FIG. 3 is an idealized circuit diagram of the circuit shown in FIG. 2, with the potential transformer reduced to its equivalent electrical components.

Referring to FIG. 3, a typical inductance for a known potential transformer of a solid-state watthour meter is shown as having the value of 2 kH. In addition, the resistance of the primary windings as well as the resistance of the iron core are shown for comparison to the value of the calibrating resistance $R_{cal}$. The following table illustrates the phase calibration obtained by different values $R_{cal}$ for the resistive component 30 for this illustrated typical meter registering a 60 Hz AC signal.

TABLE 1

| $R_{cal}$ (L) | $\Delta TAN(\theta)$ (x 10 e-3) | $\Delta\theta$ (deg.) | $\Delta V_{out}$ (%) |
|---|---|---|---|
| 500 | 0.77 | 0.044 | 0.10 |
| 1000 | 1.53 | 0.088 | 0.22 |
| 1500 | 2.30 | 0.132 | 0.30 |
| 2000 | 3.06 | 0.175 | 0.40 |
| 3000 | 4.57 | 0.262 | 0.59 |
| 4000 | 6.18 | 0.354 | 0.79 |

It is understood that the specific values and phase angle differences are based upon a specific potential transformer having specific electrical characteristics. The resistance values $R_{cal}$ are also simply representative of values that can be used in one specific embodiment to match the voltage circuit power factor to the current circuit power factor so that the load power factor provided by the AC source is accurately measured. Since it is known that the power that a watthour meter measures is equal to VI cos ($\theta$), the phase lead correction provided by $R_{cal}$ when the load is at unity power factor ($\theta=0.0$) is negligible. In other words, VI cos (0°) is different from VI cos (0°+0.35°) by only 0.002%, which is considered negligible. On the other hand, when the load is at 0.5 power factor (i.e., $\theta=60°$), a power factor correction of 0.04°–0.35° is significant. For example, the difference between VI cos (60°) and VI cos (60°+0.35°) is about 1.06%, which is considered significant in the metering art. The power factor correction provided by the values of $R_{cal}$ shown in TABLE I will have an effect on meter registration ranging approximately from 0.12% to 1.06% at a load power factor of 0.5.

As can be seen from the above equation, the added phase lead to the potential transformer primary coil is linearly dependent upon the resistance $R_{cal}$ added to the primary of the potential transformer in the voltage circuit. Ideally, the magnitude of the voltage across the secondary coil of the potential transformer is totally independent of the phase error correction. However, due to losses in the potential transformer core 27, the magnitude of the secondary coil voltage changes slightly due to the resistance $R_{cal}$ added to the equivalent resistance of the primary coil of the potential transformer (that is, the sum of $R_{primary}$ and $R_{iron}$). This effect is summarized in the last column of TABLE 1 as a change, in percentage, of the voltage output from the potential transformer secondary and provided to the measurement circuit means 14.

Using the power factor matching feature of the present invention, the value of $R_{cal}$ is first established for the meter to calibrate the power factor difference. Then, the magnitude of the secondary voltage supplied to the measurement circuit means 14 is calibrated to bring the meter within a predetermined rated accuracy value, which may be, for example, 0.1% at unity power factor. To facilitate the subsequent voltage calibration, it is desirable to limit the voltage variation produced by the calibration resistive component to less than one percent (1.0%), and more preferably less than 0.5 percent. Thus, in the preferred embodiment, the value $R_{cal}$ of the calibrating resistive component does not exceed the equivalent resistance value of the primary winding of the potential transformer.

In one specific embodiment, the calibrating resistive component 30 can comprise a variable resister as depicted in FIGS. 2 and 3. On the other hand, the calibrating resistive component 30 can comprise a selectable discrete resistor replaceably attached to the primary of the transformer. This resistor would be predetermined by the manufacturer to provide an appropriate amount of added phase lead to the potential transformer primary coil.

Figure 4:
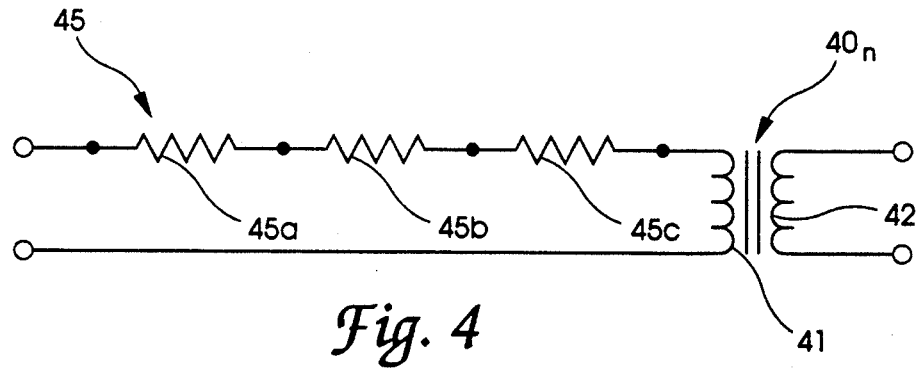
FIG. 4 is a circuit diagram of an alternative embodiment of the power factor matching feature of the present invention.
Figure 5:
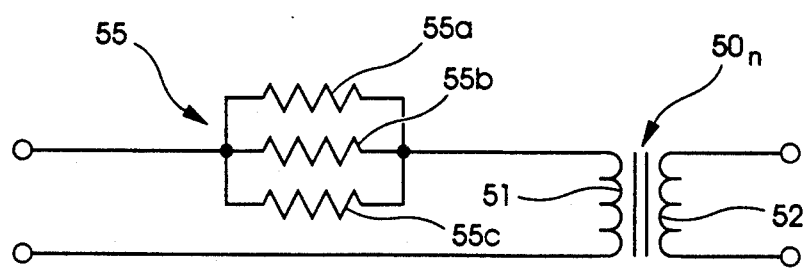
FIG. 5 is a circuit diagram of yet another alternative embodiment of the power factor matching feature of the present invention.

Further alternative embodiments utilizing a resistor array are shown in FIGS. 4 and 5. In one alternative, a potential transformer circuit $40_n$, which includes a primary circuit 41 and secondary circuit 42, is provided with a series resistor array 45, as shown in FIG. 4. The series array 45 can include a number of resistors, such as resistors 45a, 45b and 45c in the specific illustrated embodiment, each preferably having different values. An appropriate calibrating resistance value $R_{cal}$ can be achieved by shorting one or more of the series resistors in the array 45.

Similarly, the circuit diagram in FIG. 5 depicts a potential transformer circuit $50_n$ in which a parallel resistor array 55 is connected in series with the primary circuit 51. While the parallel array 55 is shown with only three resistors, 55a–55c, more parallel resistors can be provided. An appropriate calibrating resistance value $R_{cal}$ can be obtained by open circuiting one or more of the parallel resistors in array 55.

The resistor arrays 45 and 55 provide a ready means for automated calibration or power factor matching. The same array can be built into each meter and the calibration process can involve simply short or open circuiting appropriate resistors to obtain the desired calibration resistance.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A solid-state meter connected to a source of AC current and voltage for measuring AC electrical energy consumption by a load, comprising:
    a current transformer having a primary circuit including a primary coil connected to the AC source, and a secondary coil for producing a current signal proportional to the AC current;
    a potential transformer having a core, a primary coil connected across the AC source and a secondary coil for producing a voltage signal proportional to the AC voltage, wherein said primary coil produces a signal sensed by said secondary coil, and wherein said voltage signal lags said current signal by a phase angle corresponding to the power factor of the meter;
    measurement circuit means for receiving and operating on said voltage signal and said current signal to produce data corresponding to electrical energy consumption by the load;
    register means for receiving and displaying said energy consumption data; and
    power factor adjustment means for adjusting the phase angle between said voltage signal and said current signal by adjusting the phase error of said potential transformer to add a phase lead to the signal produced by said primary circuit of said potential transformer, said power factor adjustment means including only a resistive component connected in series with the input to said primary coil of said potential transformer.

2. The solid-state meter of claim 1, wherein said resistive component is a variable resistor.

3. The solid-state meter of claim 1, wherein said resistive component is a discrete resistor attached to said potential transformer.

4. The solid-state meter of claim 1, wherein said resistive component includes a plurality of resistors connected in series.

5. The solid-state meter of claim 1, wherein said resistive component includes a plurality of resistors connected in parallel.

6. The solid-state meter of claim 1, wherein:
said potential transformer has an equivalent resistance value corresponding to the resistance of said primary coil and said potential transformer core; and
said resistive component has a resistance value $R_{cal}$ having a value that when added to said equivalent resistance value leads to a total resistance value that produces a change in the voltage across said secondary coil of less than one percent.

7. A solid-state meter connected to a source of AC current and voltage for measuring AC electrical energy consumption by a load, comprising:
a current transformer having a primary circuit including a primary coil connected to the AC source, and a secondary coil for producing a current signal proportional to the AC current;
a potential transformer having a coil, a primary coil connected across the AC source and a secondary coil for producing a voltage signal proportional of the AC voltage, wherein said voltage signal lags said current signal by a phase angle corresponding to the power factor of the meter;
measurement circuit means for receiving and operating on said voltage signal and said current signal to produce data corresponding to electrical energy consumption by the load;
register means for receiving and displaying said energy consumption data; and
power factor adjustment means for adjusting the phase angle between said voltage signal and said current signal by adding a phase lead to said primary circuit of said potential transformer, said power factor adjustment means including a resistive component connected in series with the input to said primary coil of said potential transformer,
wherein said resistive component has a resistance value $R_{cal}$ selected according to the following equation:

$$R_{cal} = 2 \cdot \pi \cdot f \cdot L \cdot \Delta \text{TAN}(\theta),$$

where $R_{cal}$ is the resistance value in ohms, f is the frequency of the AC signal, L is the inductance in henrys of the potential transformer, and $\Delta \text{TAN}(\theta)$ is the difference in the tangent of the phase angle between the voltage and current signals.

8. The solid-state meter of claim 7, wherein:
said potential transformer has an equivalent resistance value corresponding to the resistance of said primary coil and said potential transformer core; and
said resistance value $R_{cal}$ has a value that when added to said equivalent resistance value leads to a total resistance value that produces a change in the voltage across said secondary coil of less than one percent.

9. The solid-state meter of claim 7, wherein said resistive component is a variable resistor.

10. The solid-state meter of claim 7, wherein said resistive component is a discrete resistor attached to said potential transformer.

11. The solid-state meter of claim 7, wherein said resistive component includes a plurality of resistors connected in series.

12. The solid-state meter of claim 7, wherein said resistive component includes a plurality of resistors connected in parallel.

13. A method of matching the power factor of the voltage circuit of an AC power meter to the load power factor of the AC source, the current circuit including a current transformer which produces a current signal and the voltage circuit including a potential transformer having an equivalent resistance which produces a voltage signal that lags the current signal and further having a primary coil that produces a signal sensed by a secondary coil to yield the voltage signal, the method comprising the steps of:
changing the equivalent resistance of the potential transformer to adjust the phase error of the transformer by connecting only a resistive component in series with the input to the primary coil of the potential transformer to add a phase lead to the signal produced by the primary of the potential transformer;
adjusting the value $R_{cal}$ of the resistive component so that the power factor of the meter corresponds to the load power factor; and
adjusting the voltage across the secondary coil of the potential transformer to account for secondary voltage deviations caused by said resistive component.

14. The method of claim 13, in which said resistive component includes a plurality of resistors connected in series and in which the step of adjusting the value $R_{cal}$ of the resistive component includes shorting across one or more of the plurality of resistors.

15. The method of claim 13, in which said resistive component includes a plurality of resistors connected in parallel and in which the step of adjusting the value $R_{cal}$ of the resistive component includes open circuiting one or more of the plurality of resistors.

16. A method of matching the power factor of the voltage circuit of an AC power meter to the load power factor of the AC source, the current circuit including a current transformer which produces a current signal and the voltage circuit including a potential transformer which produces a voltage signal that lags the current signal, the method comprising the steps of:
connecting a resistive component in series with the input to the primary coil of the potential transformer to add a phase lead to the potential transformer;
adjusting the value $R_{cal}$ of the resistive component so that the power factor of the meter corresponds to the load power factor; and
adjusting the voltage across the secondary coil of the potential transformer to account for secondary voltage deviations caused by said resistive component,
in which the step of adjusting the value of $R_{cal}$ includes determining a desired $R_{cal}$ for matching the load power factor according to the following equation:

$$R_{cal} = 2 * \pi * f * L * \Delta \text{TAN}(\theta),$$

where $R_{cal}$ is the resistance value in ohms, f is the frequency of the AC signal, L is the inductance in henrys of the potential transformer, and $\Delta \text{TAN}(\theta)$ is the difference in the tangent of the phase angle between the voltage and current signals required for the meter to accurately measure the load power factor.

17. The method of claim 16, wherein the step of adjusting the value of $R_{cal}$, the value is limited to a value less than or equal to the equivalent resistance of the primary coil of the potential transformer.

18. The method of claim 16, in which said resistive component includes a plurality of resistors connected in series and in which the step of adjusting the value $R_{cal}$ of the resistive component includes shorting across one or more of the plurality of resistors.

19. The method of claim 16, in which said resistive component includes a plurality of resistors connected in parallel and in which the step of adjusting the value $R_{cal}$ of the resistive component includes open circuiting one or more of the plurality of resistors.

* * * * *